United States Patent
Imaki et al.

(10) Patent No.: US 7,283,302 B2
(45) Date of Patent: Oct. 16, 2007

(54) WAVELENGTH FILTER AND WAVELENGTH MONITOR DEVICE

(75) Inventors: Masao Imaki, Tokyo (JP); Yoshihito Hirano, Tokyo (JP); Makoto Sato, Tokyo (JP); Akihiro Adachi, Tokyo (JP); Shinichi Takagi, Tokyo (JP); Yasunori Nisimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 75 days.

(21) Appl. No.: 10/549,325

(22) PCT Filed: Mar. 19, 2003

(86) PCT No.: PCT/JP03/03345
§ 371 (c)(1),
(2), (4) Date: Sep. 16, 2005

(87) PCT Pub. No.: WO2004/083914
PCT Pub. Date: Sep. 30, 2004

(65) Prior Publication Data
US 2006/0256437 A1    Nov. 16, 2006

(51) Int. Cl.
*G02B 5/30*    (2006.01)
(52) U.S. Cl. .............. 359/494; 359/499; 359/500
(58) Field of Classification Search .............. None
See application file for complete search history.

(56) References Cited
U.S. PATENT DOCUMENTS

| | | | |
|---|---|---|---|
| 5,982,488 A | 11/1999 | Shirasaki | |
| 6,452,725 B1 | 9/2002 | Sterling et al. | |
| 6,486,999 B1 | 11/2002 | Ackerman et al. | |
| 6,542,685 B1 | 4/2003 | Yoneda | |
| 6,816,534 B2* | 11/2004 | Flint et al. | 372/105 |
| 2001/0022793 A1 | 9/2001 | Yokoyama | |
| 2002/0061039 A1 | 5/2002 | Le Gall et al. | |

(Continued)

FOREIGN PATENT DOCUMENTS

JP    8-204638    8/1996

(Continued)

OTHER PUBLICATIONS

Imaki et al.; "Ondo Muizon Solid Etalon Hacho Filter no Kento", *The Inst. of Elec. Info. and Comm. Engineers, Electronics Society*, Taikai Koen Ronbunshu 1, (Aug. 20, 2002), C-3-94.

Primary Examiner—Stephone B. Allen
Assistant Examiner—Derek S. Chapel
(74) Attorney, Agent, or Firm—Leydig, Voit & Mayer, Ltd.

(57) ABSTRACT

A wavelength filter includes a solid material that is optically transparent and including a pair of planar surfaces substantially parallel to each other; and a supporting member that supports the solid material on a planar surface of the solid material other than the pair of planar surfaces, the supporting member having a rigidity higher than that of the solid material. The solid material is a birefringent material of which an optical axis makes a predetermined angle with respect to a normal to the pair of planar surfaces, and the wavelength filter selects light having a wavelength that is determined by an optical length between the pair of planar surfaces by resonating the light between the pair of planar surfaces.

10 Claims, 8 Drawing Sheets

U.S. PATENT DOCUMENTS

2002/0071184 A1    6/2002    Nishi et al.

FOREIGN PATENT DOCUMENTS

| JP | 11-242115 | 9/1999 |
| JP | 2000-352633 | 12/2000 |
| JP | 2001-221914 | 8/2001 |
| JP | 2001-257419 | 9/2001 |
| JP | 2002-9391 | 1/2002 |
| WO | WO 03/087898 | 10/2003 |

* cited by examiner

WAVELENGTH FILTER AND WAVELENGTH MONITOR DEVICE

TECHNICAL FIELD

The present invention relates to a wavelength filter for selecting a wavelength of a laser light output from a semiconductor laser module and a wavelength monitor for measuring an emission wavelength of a laser light using the wavelength filter, that are used for a wavelength division multiplexing (WDM) transmission.

BACKGROUND ART

For a wavelength monitor, there is a scheme in which an etalon filter is used as the wavelength monitor that detects an emission wavelength of a semiconductor laser. The etalon filter includes two flat reflecting surfaces, and with the flat reflecting surfaces, the etalon filter resonate light between the reflecting surfaces to transmit or reflect a specific wavelength. A solid etalon filter, in particular, is possible to be structured with a single part because such as structure can be obtained using an optically transparent material that a reflecting film is formed on an input/output facet. In a following description, a wavelength monitor using the solid etalon filter is explained.

The etalon filter has a characteristic in which a transmissivity varies depending on a wavelength. Therefore, it is possible to obtain a wavelength discriminating signal that is intensity information converted from wavelength information by making a laser light pass through the etalon filter. In this case, it is an important condition for monitoring the wavelength with high precision that a characteristic for discriminating the wavelength does not vary as a condition of an external environment, such as ambient temperature, changes. However, temperature dependence of the characteristic for discriminating the wavelength is dependent on a characteristic of a material of the etalon filter, and is expressed as $$\frac{d\lambda}{dT} = \frac{dn/dT + \alpha n}{n} \cdot \lambda \quad (1)$$

where $dn/dT$ is temperature-dependent variation of a refractive index, and $\alpha$ is a linear expansion coefficient.

Materials generally used for the etalon includes glass. However, with glass available at present, a numerator of on right side of the Eq. (1) is not zero. Therefore, in glass as a etalon material, there is a problem in which a wavelength discriminating characteristic varies according to a temperature change.

Many studies on development of an etalon filter that has no temperature dependence have been conducted up to now. In conventional technologies for realizing an etalon filter that has no temperature dependence, a material linear expansion coefficient compensates a ratio of change of the refractive index with respect to temperature (see, for example, U.S. Pat. No. 6,452,725). FIG. 1 is a schematic for illustrating an axis structure and a direction of an incident axis of the etalon filter described in U.S. Pat. No. 6,452,725. In an etalon filter 100, for example, a birefringent crystal LiSAF (LiSrAlF$_6$) is used as the material of which a linear expansion coefficient compensates for a ratio of change of the refractive index with respect to the temperature. A reflecting mirror mechanism is adopted on a laser-light incident plane and an output plane of the etalon filter 100. Because the LiSAF crystal is a single-axis birefringent crystal, the LiSAF crystal has an optical anisotropy, and includes an optical axis (hereinafter, "c-axis") and two axes (hereinafter, "a-axis" and "b-axis") having a refractive index and a linear expansion coefficient different from those of the c-axis. Therefore, when a laser incident angle with respect to the c-axis is θ, an optical length change of the etalon filter 100 due to a temperature change is expressed as $$\frac{dnL}{d\Delta T} = \frac{d}{d\Delta T}\frac{\sqrt{[(n_c + dn_c\Delta T)\cos(\theta)]^2 + [(n_{ab} + dn_{ab}\Delta T)\sin(\theta)]^2}}{\sqrt{[(1 + dn_c\Delta T)\cos(\theta)]^2 + [(1 + dn_{ab}\Delta T)\sin(\theta)]^2}} \quad (2)$$

where nL is the optical length, $n_c$ is a refractive index experienced by a laser light having a polarizing plane that is parallel to a plane defined by the c-axis and a direction of the optical axis, $n_{ab}$ is a refractive index experienced by a laser light having a polarizing plane that is the same as a plane perpendicular to $n_c$, $\Delta T$ is the temperature change, $dn_c$, is shift of the refractive index $n_c$ per unit temperature change, and $dn_{ab}$ is shift of the refractive index $n_{ab}$ per unit temperature change.

The optical length nL with which zero is obtained in Eq. (2) by changing the laser-light incident angle $\Delta$ with respect to the c-axis is the condition for achieving no temperature dependence, i.e., the condition for obtaining a wavelength discriminating characteristic that does not change with a temperature change. In this example of the conventional technology, setting θ=36.55° using LiSAF for the etalon material satisfies a condition with which the etalon filter 100 has no temperature dependence.

However, a fixing of the etalon filter 100 causes a change of the optical characteristic of the etalon filter 100 when the etalon filter 100 is installed in a wavelength monitor or in a semiconductor laser module including the wavelength monitor. As a result, parameters of the etalon filter 100 are deviated from the condition for achieving no temperature dependence, and when the etalon filter 100 is used for the wavelength monitor, the wavelength discriminating characteristic changes with a temperature change.

Furthermore, a change of the temperature characteristic by the laser-light incident angle θ with respect to the c-axis greatly shifts at a vicinity of the angle θ with which the condition for achieving no temperature dependence is satisfied, the condition for achieving no temperature dependence is easily deviated by a subtle change of an angle of an incident laser light.

In view of the above, and it is an object of the present invention to provide a wavelength filter that satisfies the condition for achieving no temperature dependence even when the wavelength filter is fixed at a holder and a wavelength monitor using the wavelength filter.

DISCLOSURE OF THE INVENTION

A wavelength filter according to the present invention includes a solid material that is optically transparent; a pair of flat planes formed on the solid material substantially parallel to each other; and a supporting member that supports the solid material on a plane of the solid material other than the pair of flat planes, the supporting member having a rigidity higher than that of the solid material. The solid material is a birefringent material of which an optical axis makes a predetermined angle with respect to a normal to the pair of flat planes, and the wavelength filter selects light of a wavelength that is determined by an optical length between the flat planes, by resonating the light between the flat planes.

A wavelength monitor according to the present invention includes a wavelength filter that includes a solid material that includes a solid material that is optically transparent, including a pair of flat planes formed on the solid material, substantially parallel to each other; and a wavelength detecting unit that detects an emission wavelength of the laser light based on a transmission light from the wavelength filter; and a supporting member that supports the wavelength detecting unit and the wavelength filter on a plane of the wavelength filter other than the flat planes, the supporting member having rigidity higher than that of the solid material. The wavelength monitoring apparatus detects wavelength of laser light output from a semiconductor laser, and the solid material is a birefringent material of which an optical axis makes a predetermined angle with respect to a normal to the pair of flat planes.

BEST MODE FOR CARRYING OUT THE INVENTION

Exemplary embodiments of a wavelength filter and a wavelength monitor according to the present invention will be explained in detail below with reference to the accompanying drawings.

Figure 1:
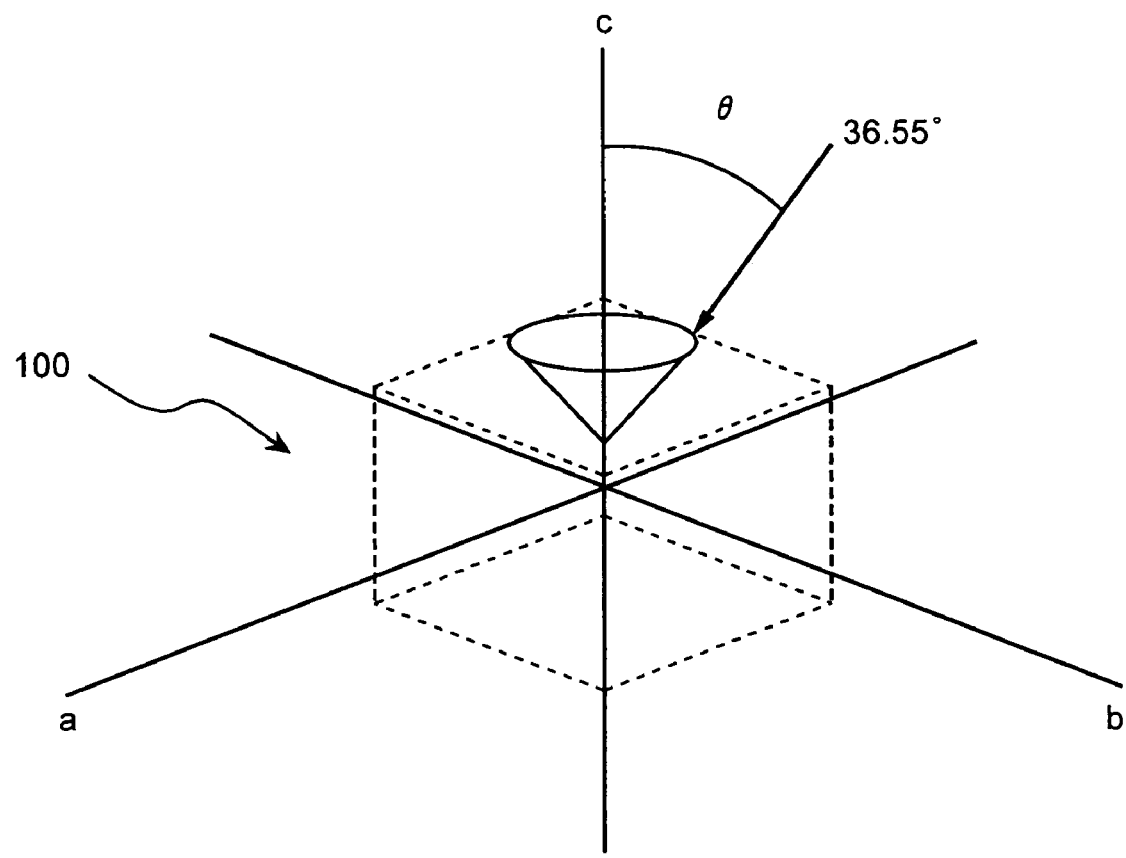
FIG. 1 is a schematic of a configuration of a conventional optical filter.
Figure 2:
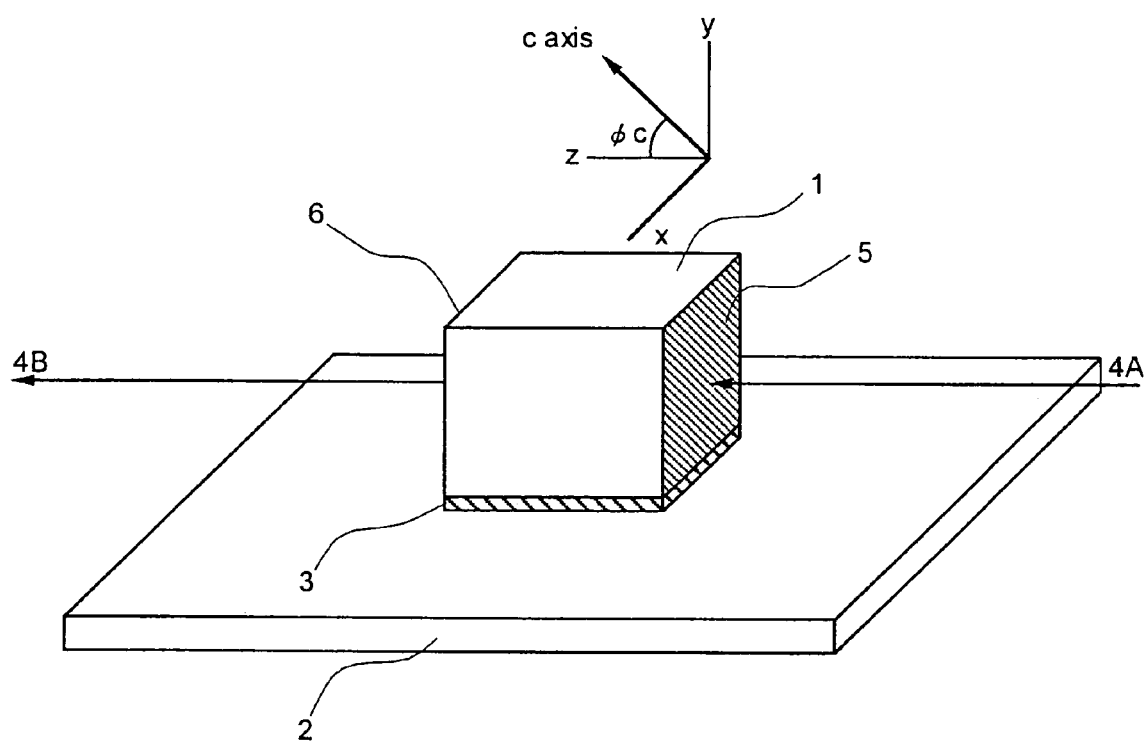
FIG. 2 is a schematic of a wavelength filter according to a first embodiment of the present invention.

FIG. 2 is a schematic of a wavelength filter according to a first embodiment of the present invention. As shown in FIG. 2, a wavelength filter has a structure in which an etalon filter 1 is supported on a holder 2 by an adhesive agent 3. In the fist embodiment, a traveling direction (direction of light axis) of a laser light is determined as a direction of z-axis in space coordinates, an upward direction in a space is determined as a direction of y-axis, and a downward direction in the space is determined as a direction of x-axis.

The etalon filter 1 includes reflecting films 5, 6 on an incident plane and an output plane, i.e., surface, reflecting the laser light, and is formed with an optically-uniaxial birefringent crystal (such as, α-BBO ($BaB_2O_4$) crystal, $LiIO_3$ crystal, $CaCo_3$ crystal, and β-BBO crystal). The optically-uniaxial birefringent crystal used as the etalon filter 1 is cut in such a manner that c-axis of the optically-uniaxial birefringent crystal is arranged to make a predetermined angle $\phi c$ with respect to an optical axis of the laser light (z-axis), and a cutout plane of the optically-uniaxial birefringent crystal is arranged in parallel with an xy-plane that is perpendicular to the optical axis (z-axis).

The holder 2 is a substrate that supports the etalon filter 1. The holder 2 is bigger than the etalon filter 1, and is formed with a material having rigidity higher than that of the etalon filter 1. As for a material for the holder 2, for example, a CuW substrate can be used. The holder 2 supports a plane of the etalon filter 1 other than the plane on which the reflecting films 5, 6 are formed (i.e., as long as the optical path of the etalon filter 1 is not blocked, any plane can be used).

The adhesive agent 3 fixes the holder 2 and the etalon filter 1 by bonding the holder 2 and the etalon filter 1. As for a material for the adhesive agent 3, for example, an ecobond SOLDER56C (trade name) that is a conductive adhesive-agent manufactured by EMERSON, Ltd. can be used.

A transmission characteristic of the laser light transmitted through the etalon filter 1 with respect to the wavelength is kept constant regardless of changes of temperature of the etalon filter 1, the adhesive agent 3, and the holder 2.

Following is an explanation of a condition for no temperature dependence of the etalon filter 1 that is fixed on the holder 2 by the adhesive agent 3. A laser light A4 incident on an incident plane 5 of the etalon filter 1 that is fixed on the holder 2 shown in FIG. 2 has a p-polarized light in parallel with the x-axis. In the etalon filter 1, the c-axis of the optically-uniaxial birefringent crystal in on a yz-plane, the optical axis is in parallel with the z-axis, and the c-axis makes a predetermined angle $\phi_c$ (hereinafter, "optical axis angle") with respect to the optical axis. An ordinary light is perpendicular to a plane made by the c-axis and the optical axis with a same oscillation plane as a plane that is in parallel with the optical axis. Therefore, in this case, the laser light A4 propagates through the etalon filter 1 as the ordinary light.

Before explaining a temperature characteristic of the etalon filter 1 in a state in which the etalon filter 1 is fixed on the holder 2, a temperature characteristic of a single piece of the etalon filter 1 will be explained. The temperature characteristic of refractive index experienced by the laser light that transmits through the etalon filter 1 is expressed as $dn_o/dT$ using ordinary-light-axis refractive index $n_o$. A linear expansion coefficient $\alpha(\phi_c)$ is expressed as $$\alpha(\phi_c)=\alpha_c\cos^2\phi_c+\alpha_a\sin^2\phi_c \qquad (3)$$

where $\alpha_c$ is a linear expansion coefficient in a direction parallel to the c-axis, and $\alpha_a$ is a linear expansion coefficient in a direction perpendicular to the c-axis.

A temperature dependence of a wavelength characteristic with respect to the ordinary light can be expressed as $$\frac{d\lambda}{dT} = \frac{dn_o/dT + \alpha(\phi_c)n_o}{n_o}\lambda_0 \quad (4)$$

using $dn_o/dT$ and $\Delta(\phi_c)$

When a laser light 4B output from the etalon filter 1 has an s-polarized light in parallel with the y-axis, it is the case that the laser light 4A propagates through the etalon filter 1 as an extraordinary light. In this case, the refractive index experienced by the laser light is expressed as a function of the angle φc between the c-axis and the optical axis, and the temperature dependence of the wavelength characteristic is expressed as $$\frac{d\lambda}{dT} = \frac{dn(\phi_c)/dT + \alpha(\phi_c)n(\phi_c)}{n(\phi_c)}\lambda_0 \quad (5)$$

where $dn(\phi_c)/dT$ is a temperature coefficient of the refractive index $n(\phi_c)$ experienced by the extraordinary light, expressed as $$\frac{dn(\phi_c)}{dT} = \frac{d}{dT}n_0\sqrt{\frac{1+\tan^2\phi_c}{1+(n_0/n_c)^2\tan^2\phi_c}} \quad (6)$$

Figure 3:
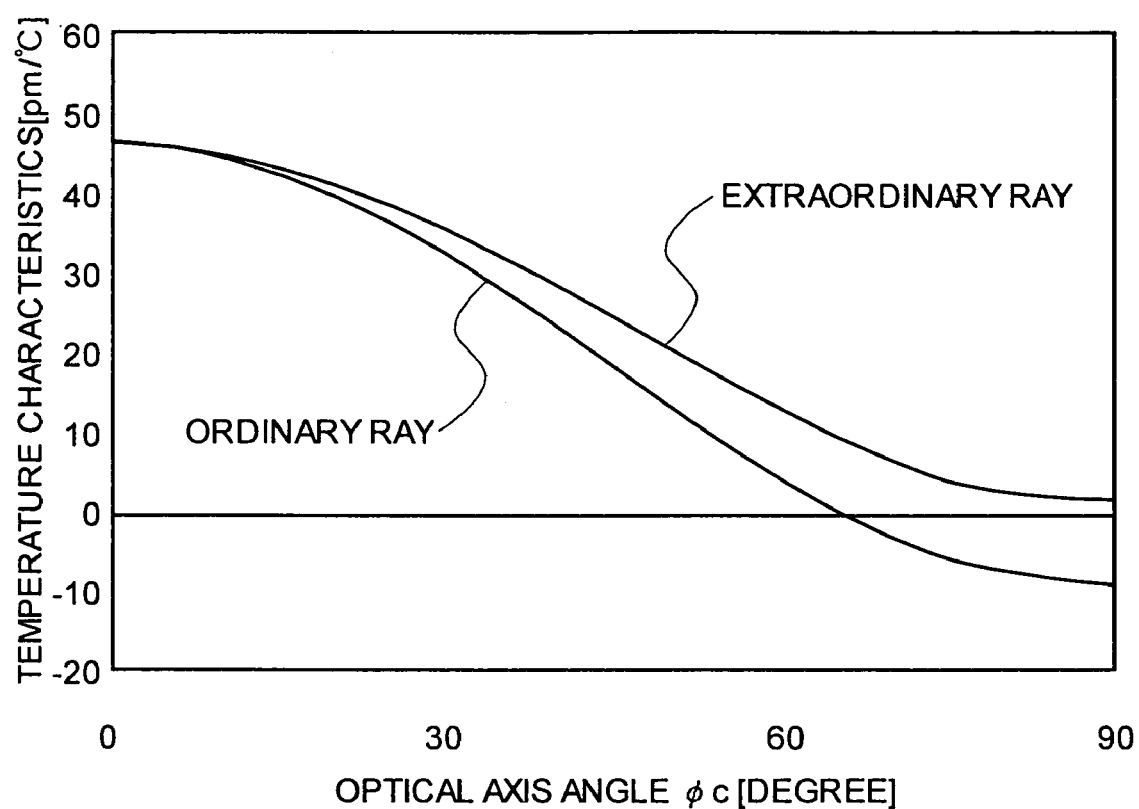
FIG. 3 is a graph for illustrating a relation between an angle $\phi_c$ between an optical axis and c-axis and a temperature characteristic in a single piece of filter according to the first embodiment.

FIG. 3 is a graph for illustrating a relation between the angle $\phi_c$ and the temperature characteristic of the wavelength characteristic in the extraordinary light and the ordinary light calculated using Eq. (4) and Eq. (5) when $CaCo_3$ crystal is used as the material for the etalon filter 1. The physical constants of the $CaCo_3$ used in the calculation are as follows: the extraordinary-light refractive index $n_e$ is 1.4771, the ordinary-light refractive index $n_o$ is 1.6337, the temperature coefficient of refractive index in a direction of extraordinary light axis $dn_e/dT$ is $1.19\times10^{-5}$/K, the temperature coefficient of refractive index in a direction of ordinary light axis $dn/dT$ is $2.10\times10^{-6}$/K, the linear expansion coefficient $\alpha_a$ is $-5.70\times10^{-6}$/K, and the linear expansion coefficient $\alpha_c$ is $2.44\times10^{-6}$/K. From FIG. 3, it is found that the temperature characteristic can be freely set from +4 pm/° C. to +40 pm/° C. in a direction of the extraordinary light axis, and −7 pm/° C. to +40 pm/° C. in a direction of the ordinary light axis, by changing the optical axis angle φc. For instance, the condition for no temperature dependence for $CaCO_3$ crystal when using the ordinary light can be obtained as a point at which the temperature characteristic of the ordinary light becomes zero, i.e., a vicinity of the optical axis angle of 63°.

Following is an explanation of the temperature characteristic of the etalon filter 1, a single piece of the optically-uniaxial birefringent material, with respect to the optical axis angle $\phi_c$ in a state in which the etalon filter 1 is fixed on the holder 2 by the adhesive agent 3. The thickness of the adhesive agent 3 is thin enough so that a thermal characteristic of the adhesive agent 3 can be ignored. A linear expansion coefficient of the holder 2 is defined as $\alpha_2$. Since the holder 2 has a rigidity stronger than that of the etalon filter 1, an effective linear expansion coefficient of the etalon filter α' can be expressed as $$\alpha' = \alpha_2 - \alpha(\phi_c) \quad (7)$$

Besides, to incorporate a refractive index change due to a strain (photo-elastic effect), a photo-elastic constant in a direction of the z-axis is set as $P_{ZO}$, and a photo-elastic constant in a direction of the x-axis is set as $P_{XO}$, when the ordinary light is incident (a photo-elastic constant in a direction of the z-axis is set as $P_{ze}$, and a photo-elastic constant in a direction of the x-axis is set as $P_{xe}$, when the extraordinary light is incident). Since an amount of the strain due to a thermal expansion is expressed by a difference of the linear expansion coefficients of the etalon filter 1 and the holder 2, a change of refractive index due to the strain in a direction of the z-axis can be expressed as in the case of the ordinary light, $$\Delta n_{zo} = -\frac{1}{2}n_o^3 P_{zo}(\alpha_2 - \alpha(\phi_c)) \quad (8)$$

and in the case of the extraordinary light, $$\Delta n_{zo} = -\frac{1}{2}n(\phi_c)^3 P_{ze}(\alpha_2 - \alpha(\phi_c)) \quad (8')$$

A change of refractive index due to the strain in a direction of the x-axis can be expressed as in the case of the ordinary light $$\Delta n_{xo} = -\frac{1}{2}n_o^3 P_{xo}(\alpha_2 - \alpha_a) \quad (9)$$

and in the case of the extraordinary light $$\Delta n_{xo} = -\frac{1}{2}n(\phi_c)^3 P_{xo}(\alpha_2 - \alpha_a) \quad (9')$$

Assuming that the strain in a direction of the y-axis is small enough to be ignored, it can be considered that $\Delta n_{xo}$ and $\Delta n_{zo}$ are added to the temperature coefficient of the refractive index in the case of the ordinary light. Then, the temperature coefficient of the refractive index in a direction of the ordinary light $dn'/dT$ can be expressed as $$\frac{dn'}{dT} = \frac{dn_o}{dT} + \Delta n_{zo} + \Delta n_{xo} \quad (10)$$
$$= \frac{dn_o}{dT} - \frac{1}{2}n_o^3 P_{zo}(\alpha_2 - \alpha(\phi_c)) - \frac{1}{2}n_o^3 P_{xo}(\alpha_2 - \alpha_a)$$

Similarly, the temperature coefficient of the refractive index in a direction of the extraordinary light can be expressed as $$\frac{dn'}{dT} = \frac{dn(\phi_c)}{dT} + \Delta n_{ze} + \Delta n_{xe} \quad (11)$$
$$= \frac{dn(\phi_c)}{dT} - \frac{1}{2}n(\phi_c)^3 P_{ze}(\alpha_2 - \alpha(\phi_c)) -$$
$$\frac{1}{2}(n(\phi_c)^3 P_{xe}(\alpha_2 - \alpha_a)$$

From these equations, the temperature dependence of the wavelength characteristic when the etalon filter 1 is fixed on the holder 2 can be expressed as in the case of the ordinary light $$\frac{d\lambda}{dT} = \frac{dn'/dT + \alpha' n_o}{n_o} \lambda_o \qquad (12)$$

and in the case of the extraordinary light $$\frac{d\lambda}{dT} = \frac{dn'/dT + \alpha' n(\phi_c)}{n(\phi_c)} \lambda_o \qquad (13)$$

From Eqs. (12) and (13), because the temperature dependences of the wavelength characteristic in the both cases are functions of the optical axis angle $\phi_c$, it is possible to satisfy the condition for no temperature dependence by selecting the optical axis angle $\phi_c$ that makes the numerator of the right side zero. Furthermore, because the temperature characteristic of the single piece of the etalon filter 1 can be freely changed within the range shown in FIG. 3 by adjusting the optical axis angle $\phi_c$, even when an optional adhesive agent 3 and an optional holder 2 are used, it is possible to fix the etalon filter 1 under the condition for no temperature dependence or a condition close to the condition for no temperature dependence. Although, in the first embodiment, only a bottom plane of the etalon filter 1 is fixed on the holder 2, any plane of the etalon filter can be fixed as long as the optical path is not blocked. For instance, using a holder having a configuration in which all side planes with respect to the optical axis are covered can obtain the same effect.

The above explanation is for a case of obtaining the condition for no temperature dependence of the etalon filter 1 that is fixed on the holder 2 using Eqs. (12) and (13). Following is an explanation for a method of obtaining the condition for no temperature dependence when the etalon filter 1 is fixed on the holder 2 without using the Eqs. (12) and (13).

Figure 4:
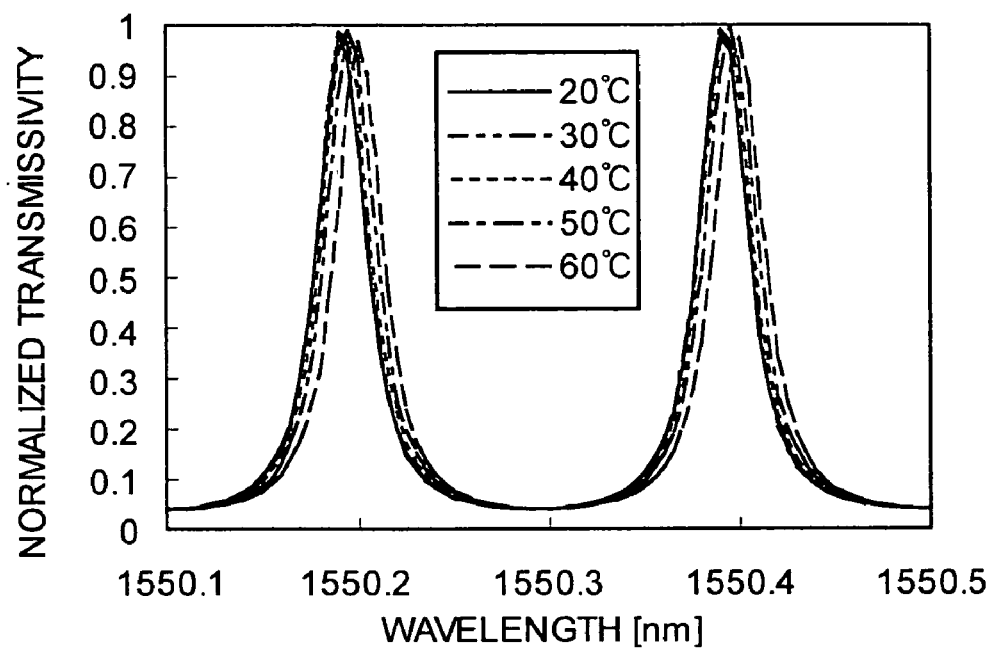
FIG. 4 is a graph for illustrating a temperature characteristic of a single piece of etalon filter according to the first embodiment.
Figure 5:
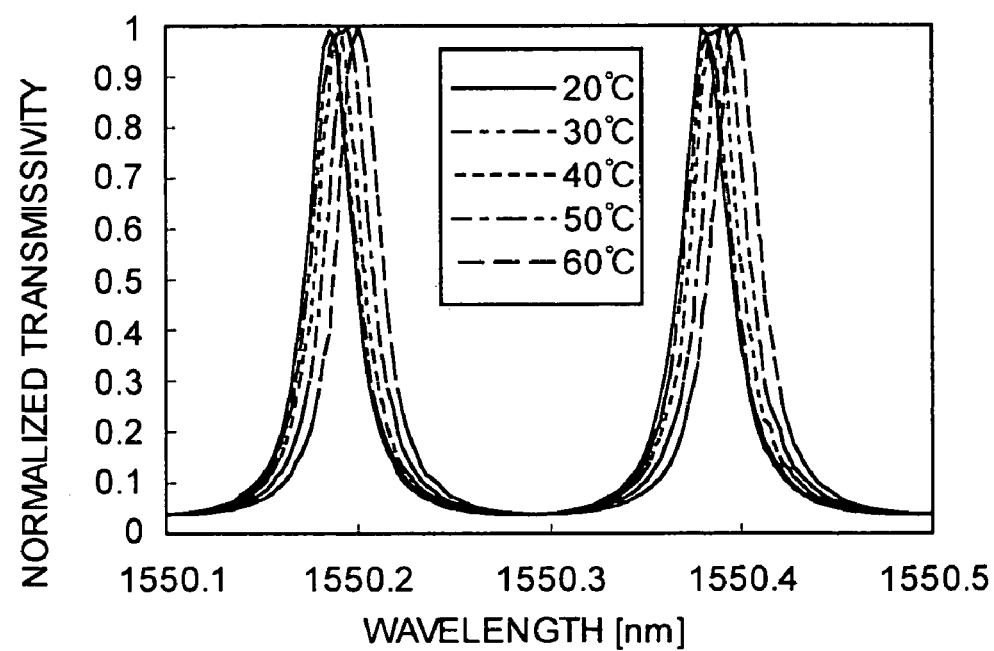
FIG. 5 is a graph for illustrating a temperature characteristic of the single piece of etalon filter according to the first embodiment when the etalon filter is fixed in a holder.

FIG. 4 is a graph of the wavelength characteristic of the single piece of etalon filter (in a state in which the etalon filter is not fixed on the holder) when the temperature is changed; and FIG. 5 is a graph of the wavelength characteristic in a state in which the same etalon filter is fixed on the holder. In the experiment for obtaining the wavelength characteristics shown in these figures, a $CaCO_3$ crystal having an optical axis angle $\phi_c=65.70°$ and a thickness (length of the crystal in a direction of the z-axis) of 3.6 mm is used for the material for the etalon filter 1, and the conductive adhesive-agent manufactured by EMERSON, Ltd., ecobond SOLDER56C (trade name), is used for the material for the adhesive agent 3. From these figures, the temperature characteristics are obtained as 0.23 pm/° C. and 0.45 pm/° C., respectively.

Figure 6:
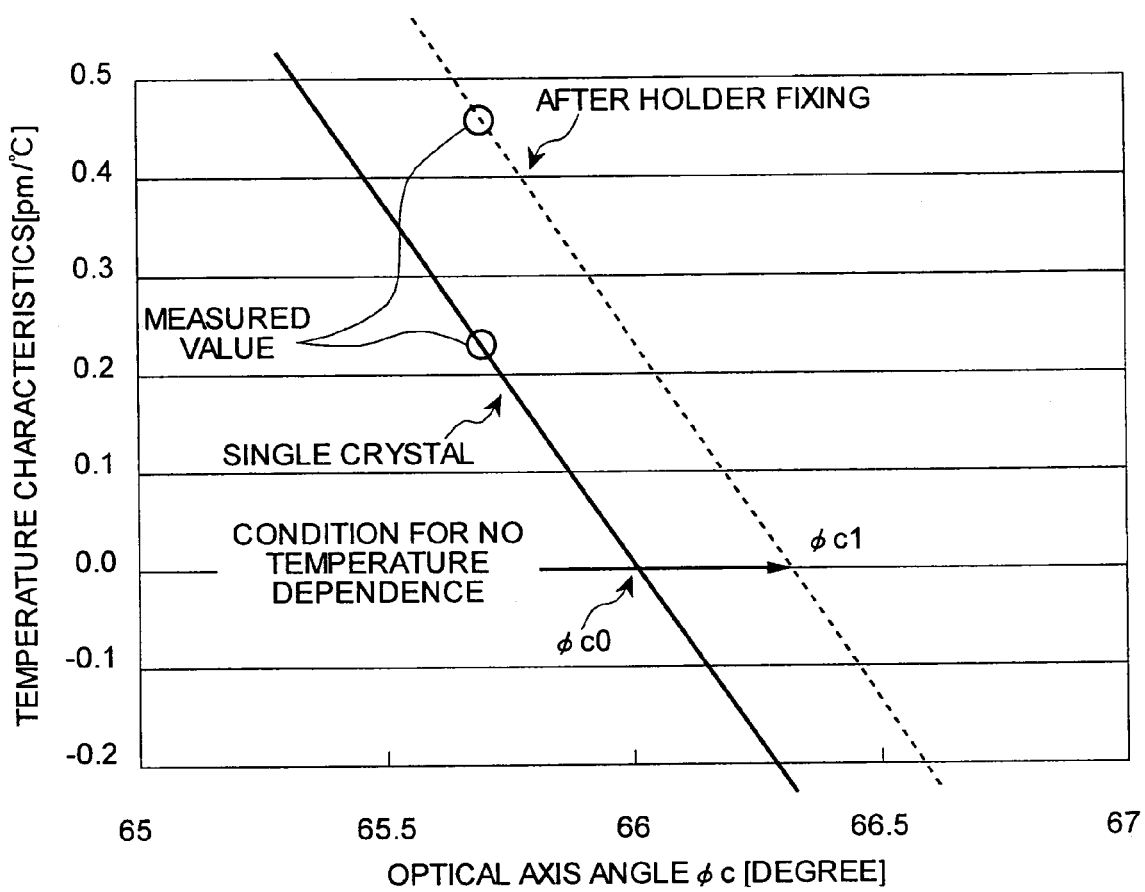
FIG. 6 is an enlarged graph of temperature dependence of the angle $\phi_c$ between the optical axis and the c-axis of the filter according to the first embodiment and the wavelength characteristic.

FIG. 6 is an enlarged graph of a vicinity of the optical axis angle $\phi_c=66.0°$ in the graph shown in FIG. 3, with a plotting of data of the temperature characteristic obtained from FIG. 4 and FIG. 5. From FIG. 6, it is found that the optical axis angle $\phi_c$ that satisfies the condition for no temperature dependence is deviated due to a fixing of the etalon filter 1 on the holder 2. In other words, by shifting the optical axis angle from the optical axis angle $\phi_c=66.0°$ that satisfies the condition for no temperature dependence obtained for the single piece of the etalon filter 1 to the optical axis angle $\phi_{c1}=66.3°$ that satisfies the condition for no temperature dependence for the etalon filter 1 fixed on the holder 2, the etalon filter 1 fixed on the holder 2, having a structure with a wavelength characteristic that does not change with a temperature change, can be obtained.

Although, an aluminum substrate is used for the holder 2 and the conductive adhesive agent is used for the adhesive agent 3 in this experiment, even when the holder 2 and the adhesive agent 3 made of other materials are used, it is possible to obtain the optical axis angle $\phi_c$ that satisfies the condition for no temperature dependence by measuring the temperature dependence of the wavelength characteristic due to a fixing of the etalon filter 1 on the holder 2.

Furthermore, although the $CaCO_3$ crystal is used for the material for the etalon filter 1 in the first embodiment, other optically-uniaxial birefringent materials, such as $\alpha$-BBO crystal, $\beta$-BBO crystal, and $LiIO_3$ crystal, can also be used. Even in the case in which other optically-uniaxial birefringent materials are used, it is possible to obtain a condition for no temperature dependence with respect to the optical axis angle $\phi_c$, as shown in FIG. 3, and it is possible to obtain the optical axis angle $\phi_c$ that satisfies the condition for no temperature dependence for the etalon filter 1 fixed on the holder 2 using Eqs. (12) and (13).

Moreover, although the etalon 1 is fixed on the holder 2 using the adhesive agent 3 in the first embodiment, other fixing methods can also be used, such as a soldering and a YAG welding. Even in the case in which other fixing methods are used, it is possible to achieve the no temperature dependence of the etalon filter 1 fixed on the holder 2, by adjusting the optical axis angle $\phi_c$ of the etalon filter 1 after fixing the etalon filter 1 on the holder 2.

As explained above, according to the first embodiment, a structure, with which a condition for no temperature dependence when the etalon filter 1 is fixed on the holder 2 is satisfied, can be obtained by considering an effective linear expansion coefficient and a refractive index change due to a photo-elastic effect by a strain caused by a difference of the rigidity between the etalon filter 1 and the holder 2 in addition to a change of temperature characteristic with respect to the optical axis angle $\phi_c$ of a single piece of the etalon filter 1. In other words, even if a material for the holder 2 and a material for the adhesive agent 3 having optional linear expansion coefficients are used for fixing the etalon filter 1, by obtaining the optical axis angle $\phi c$ that satisfies the condition for no temperature dependence from the temperature characteristic of the etalon filter 1 fixed by each of the combinations of the materials, it is possible to obtain the condition for no temperature dependence for the etalon filter 1 fixed by the combination of the materials. In this manner, even with the etalon filter 1 having a temperature dependence in a state of a single piece of crystal, it is possible to achieve a structure that satisfies the condition for no temperature dependence in a state in which the etalon filter 1 is fixed on the holder 2. Therefore, the wavelength characteristic of the etalon filter 1 obtained from this structure is not affected by the temperature change.

According to the first embodiment, the laser light from the semiconductor laser is set to a p-polarized light, and the laser light is incident on the etalon filter 1 as an ordinary light. However, the laser light from the semiconductor laser can be set to an s-polarized light, and the laser light can be incident on the etalon filter 1 as an extraordinary light. In this case, the same effect can be achieved by using the optical axis angle $\phi_c$ that satisfies Eq. (13), i.e., by using the optical axis angle $\phi_c$ that satisfies the condition for no temperature dependence in a state in which the etalon filter 1 is fixed on the holder 2.

According to a second embodiment of the present invention, a semiconductor laser module that includes a wavelength monitor equipped with an etalon filter according to the first embodiment, which is fixed on a holder, having no temperature dependence is explained.

Figure 7:
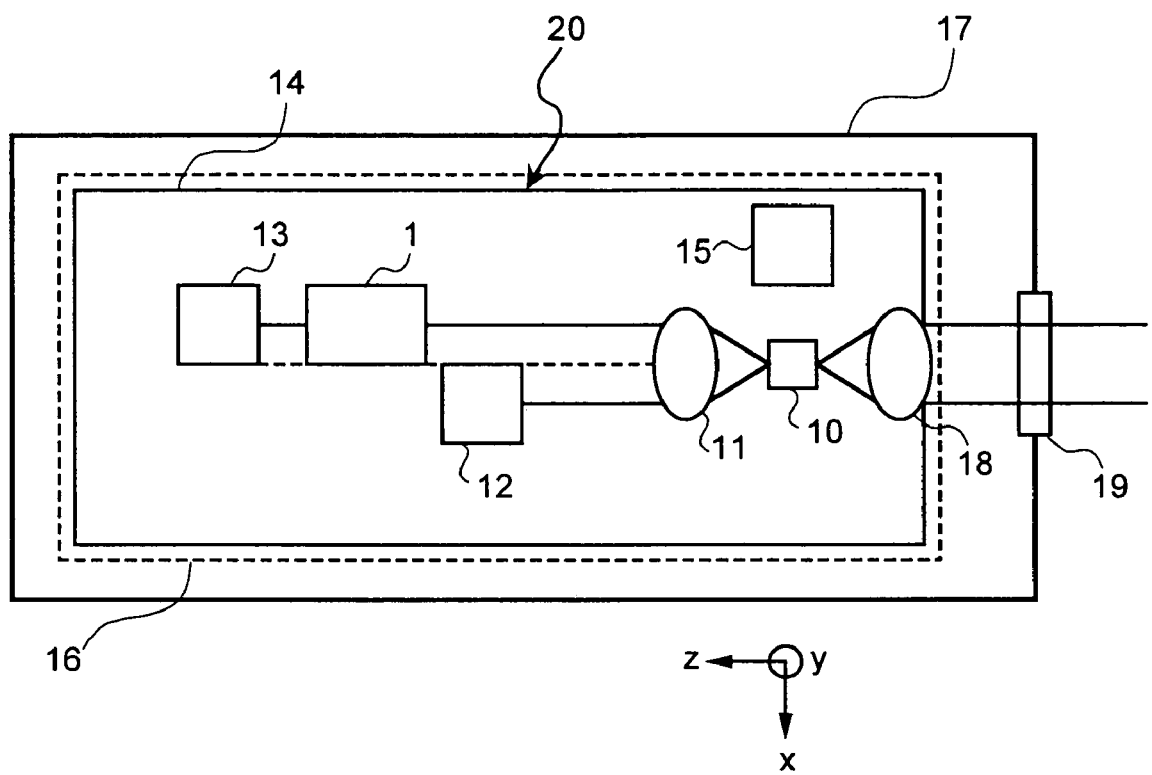
FIG. 7 is a schematic of a configuration of a semiconductor laser module that includes a wavelength monitor according to a second embodiment of the present invention.

FIG. 7 is a schematic diagram of a semiconductor laser module equipped with a wavelength monitor according to the second embodiment. According to the second embodiment, a traveling direction of a laser light (a direction of the optical axis) is determined as z-axis in a space coordinates, an upward direction in a space (a protruding direction perpendicular to a surface of the paper in FIG. 3) is determined as a direction of y-axis, a direction perpendicular to the z-axis and the y-axis is determined as a direction of x-axis, and a position at which a semiconductor laser 10 is installed is determined as an origin of the z-axis.

The semiconductor laser module has a structure in which a wavelength monitor 20 equipped with the etalon filter 1 fixed on the holder according to the first embodiment, and a Peltier cooler 16 connected to a bottom surface of the wavelength monitor 20 are assembled in a module package 17 that shields against the outside air.

The wavelength monitor 20 includes the etalon filter 1 that transmits a specific wavelength only, the semiconductor laser 10 that outputs a laser light, a first lens 11 that is arranged in front of the semiconductor laser 10 (a positive direction of the z-axis) and adjusts a beam diameter of the laser light output from the semiconductor laser 10 (hereinafter, "an optical signal"), and a second lens 18 that is arranged behind the semiconductor laser 10 (a negative direction of the z-axis) and adjusts the laser light output from the semiconductor laser 10.

The etalon filter 1 is an etalon made of the optically-uniaxial birefringent crystal according to the first embodiment, such as α-BBO crystal, CaCO₃ crystal, LiIO₃ crystal, and β-BBO crystal. A reflecting film is formed on an input facet and an output facet of the etalon filter 1 for the laser light, and the etalon filter 1 is installed in such a manner that the input facet and the output facet is perpendicular to the optical axis. The c-axis of the etalon filter 1 is in the yz-plane, as shown in FIG. 2, making a predetermined angle $\phi_c$ with respect to the optical axis.

The semiconductor laser 10 is a laser that can tune a wavelength of the laser light by adjusting an injection current or a temperature, such as a distributed feedback (DFB) laser having a grating in an active layer, a wavelength-tunable laser that can tune the wavelength of the laser light by adjusting the injection current or the temperature (such as a distributed bragg reflector (DBR) laser and a vertical cavity surface emitting laser (VCSEL)), and an EA modulator-integrated laser diode (EA-LD) in which an electro-absorption device and a laser diode are integrated. The input facet and the output facet of the etalon filter 1 for the optical signal are substantially perpendicular to the optical axis.

The wavelength monitor 20 further includes a first light sensitive element 12 that converts the optical signal passed through the first lens 11 into an electrical signal, and a second light sensitive element 13 that converts the optical signal passed through the first lens 11 and the etalon filter 1 into an electrical signal.

The etalon filter 1, the first lens 11, the first light sensitive element 12, the second light sensitive element 13, and the second lens 18 are fixed on a carrier 14. The carrier 14 is bigger enough than the etalon filter 1, made of a material having a rigidity stronger than that of the etalon filter 1, and equivalent to the holder 2 according to the first embodiment.

The wavelength monitor 20 further includes a thermistor 15 that detects a temperature signal. The thermistor 15 is directly fixed on the carrier 14.

The Peltier cooler 16 is connected on a bottom surface of the carrier 14. By driving the Peltier cooler 16 using the temperature signal from the thermistor 15, it is possible to carry out a temperature control of the entire carrier 14. With this mechanism, it is possible to tune the wavelength of the semiconductor laser 10.

On a wall of the module package 17, a window 19 is arranged to emit the laser light that is output from the semiconductor laser 10 in the wavelength monitor 20, and passed through the second lens 18 to outside.

Following is an explanation for an operation of the semiconductor laser module having the above structure. A laser light having a plane of polarization oscillating in the direction of the x-axis is output from the semiconductor laser 10 in both positive and negative direction of the z-axis. The laser light output in the positive direction of the z-axis (optical signal) is collimated by the first lens 11. The axis passing through the semiconductor laser 10 and a center of the first lens 11 becomes the optical axis. On the other hand, the laser light output in the negative direction of the z-axis is collimated by the second lens 18, and passes through the window 19 to be output to the outside of the module package 17 as an optical signal. From this point on, a case in which the optical signal output on a side of the first lens 11 is explained.

A half of a cross section of a beam of the laser light (optical signal) passed through the first lens 11 (an area of the optical signal on a side of the direction of the x-axis from the optical axis shown in FIG. 7) is directly input to the first light sensitive element 12. The first light sensitive element 12 is arranged with an input facet slant against the optical axis between the first lens 11 and the etalon filter 1 along the z-axis in such a manner that the half of the cross section of the beam of the optical signal is input to the input facet. The first light sensitive element 12 receives the optical signal from the semiconductor laser 10, which does not pass through the etalon filter 1, detects an intensity of the optical signal, and outputs a power monitor signal. Because the power monitor signal is proportional to an output intensity of the semiconductor laser 10, it is possible to stabilize the laser light output from the semiconductor laser 10 at an optional output intensity by controlling the injection current to the semiconductor laser 10 using the power monitor signal. Furthermore, as shown in the figure, the first light sensitive element 12 is arranged closer to the semiconductor laser 10 than the etalon filter 1, a transmission light having a predetermined wavelength characteristic output from the etalon filter 1 is not input to the input facet of the first light sensitive element 12.

The second light sensitive element 13 is arranged at a subsequent stage of the etalon filter 1 (the positive direction of the z-axis) with an input facet slant against the optical axis. The second light sensitive element 13 receives a component of the laser light passed through the etalon filter 1 from among the component of the rest of the cross section of the beam of the optical signal that is not received by the first light sensitive element 12. The second light sensitive element 13 detects an intensity of the laser light received, and outputs a wavelength monitor signal. The wavelength monitor signal indicates a wavelength discriminating characteristic based on the wavelength characteristic of the etalon filter 1. Therefore, it is possible to stabilize the wavelength of the laser light output from the semiconductor laser 10 by controlling the injection current to the semiconductor laser 10 or the temperature, using an error signal between a wavelength obtained from the wavelength monitor signal and a target wavelength for stabilization. Furthermore, by normalizing the wavelength monitor signal with the power monitor signal output from the first light sensitive element 12, a normalized wavelength monitor signal that does not depend on a change of the intensity of the laser light from the semiconductor laser 10 can be obtained. By using the normalized wavelength monitor signal, it is possible to realize a wavelength stabilization of the laser light output from the semiconductor laser 10 with even higher precision.

Figure 8:
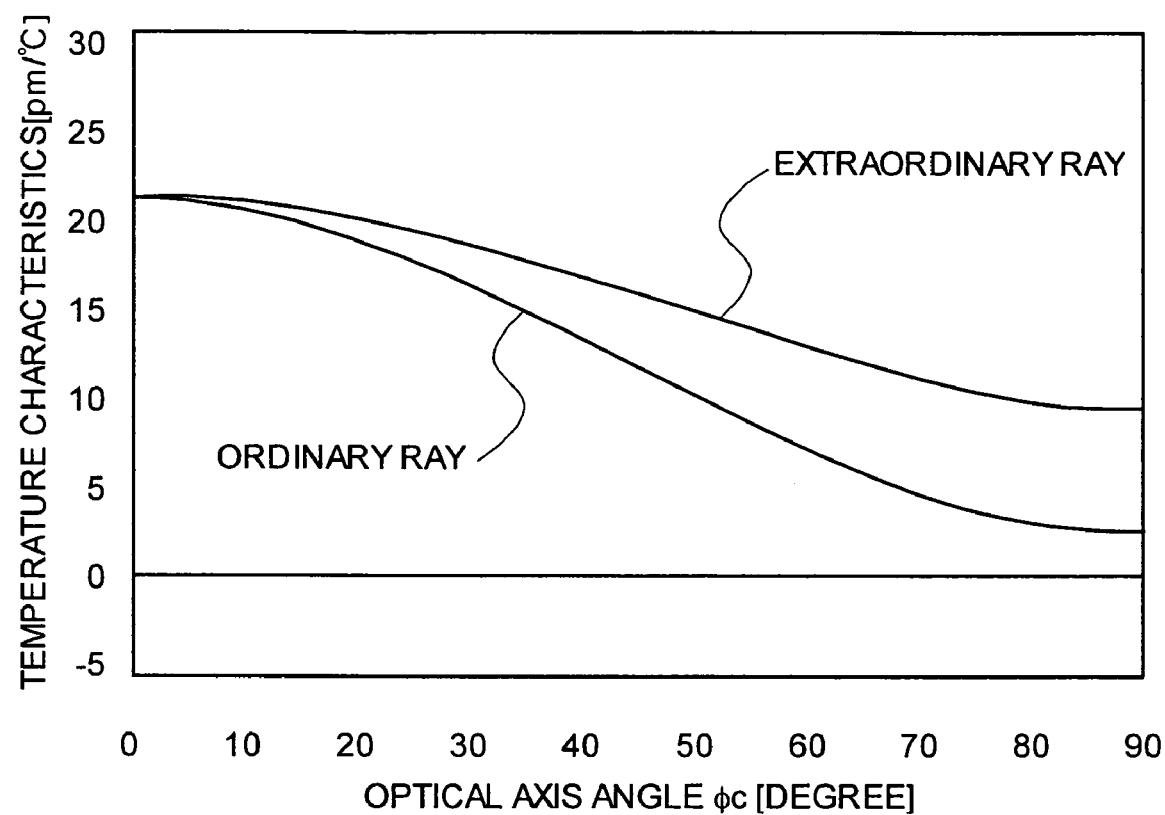
FIG. 8 is a graph of temperature dependence of an angle $\phi_c$ between the optical axis and the c-axis and wavelength characteristics of a single piece of etalon filter according to the second embodiment.

FIG. 8 is a graph of temperature dependence of the wavelength characteristic with respect to the optical axis angle $\phi_c$ for the ordinary light and the extraordinary light when a single piece of the α-BBO crystal is used as the etalon filter 1. The physical constants used in the calculation are as follows: the extraordinary-light refractive index $n_e$ is 1.53003, the ordinary-light refractive index $n_o$ is 1.6502, the temperature coefficient of refractive index in a direction of extraordinary light axis $dn_e/dT$ is $1.60 \times 10^{-5}$/K, the temperature coefficient of refractive index in a direction of ordinary light axis $dn_o/dT$ is $-9.15 \times 10^{-6}$/K, the linear expansion coefficient $\alpha_a$ is $7.17 \times 10^{-6}$/K, and the linear expansion coefficient $\alpha_c$ is $1.92 \times 10^{-6}$/K.

From FIG. 8, it is found that the temperature characteristic can be freely set from +9.5 pm/° C. to +21 pm/° C. in a direction of the extraordinary light axis, and +2.5 pm/° C. to +21 pm/° C. in a direction of the ordinary light axis, by changing the optical axis angle $\phi_c$ of the α-BBO crystal on the yz-plane from 0° to 90°. Following explanation is for a case in which the optical axis angle $\phi_c$ of the etalon filter 1 is set to 90°.

According to the second embodiment, the laser light (optical signal) incident on the etalon filter 1 propagates through the etalon filter 1 as in the case of the first embodiment, and under the above conditions, a single piece of the etalon filter 1 has a temperature characteristic of as low as 2.5 pm/° C. Furthermore, because a temperature dependence due to a change of the optical axis angle $\phi_c$ is small at the optical axis angle $\phi_c$ (=90°), a change of the temperature characteristic due to a deviation of an angle of the laser light is small. Moreover, because the optical axis angle $\phi_c$ of the etalon filter 1 is set to a right angle, and the input facet is also arranged at a right angle, a change of the wavelength characteristic with respect to a deviation of the optical axis is suppressed.

In addition, by setting a thickness of the etalon filter 1 (a length of the crystal in the direction of the z-axis) to approximately 3.5 mm, and setting a free spectral range (FSR) that is a cycle range of the wavelength characteristic to 25 GHz, it is possible to comply to 25 GHz range of International Telecommunication Union Telecommunication Standardization Sector (ITU-T) grid.

Because, the etalon filter 1 is fixed on the carrier 14 by an adhesive agent (for example, a conductive adhesive-agent manufactured by EMERSON, Ltd., ecobond SOLDER56C (trade name)), it is near the condition for no temperature dependence in this state, considering an effective linear expansion coefficient and a refractive index change due to a photo-elastic effect by a strain caused by a difference of the rigidity between the etalon filter 1 and the carrier 14, a explained in the first embodiment.

In a state in which a temperature of parts on the carrier 14 is controlled to a predetermined temperature by the thermistor 15 and the Peltier cooler 16, even if the temperature of the outside of the module package 17 is changed, there is ideally no change of the temperature on the carrier 14 in the module package 17 from a property of the structure, although the temperature of the module package 17 is changed according to a temperature change of the outside. However, in practice, there is an extremely small amount of temperature change in each of the parts because there is a thermal resistance between the thermistor 15 and each of the parts.

With the structure of the wavelength monitor 20 according to the second embodiment, when the temperature of the outside air is changed from −20° C. to +70° C., a temperature change of 2° C. occurs on the etalon filter 1. For this reason, if the etalon filter 1 has a temperature dependence, the wavelength characteristic changes, and as a result, the wavelength monitor signal cannot indicate a correct value.

Figure 9:
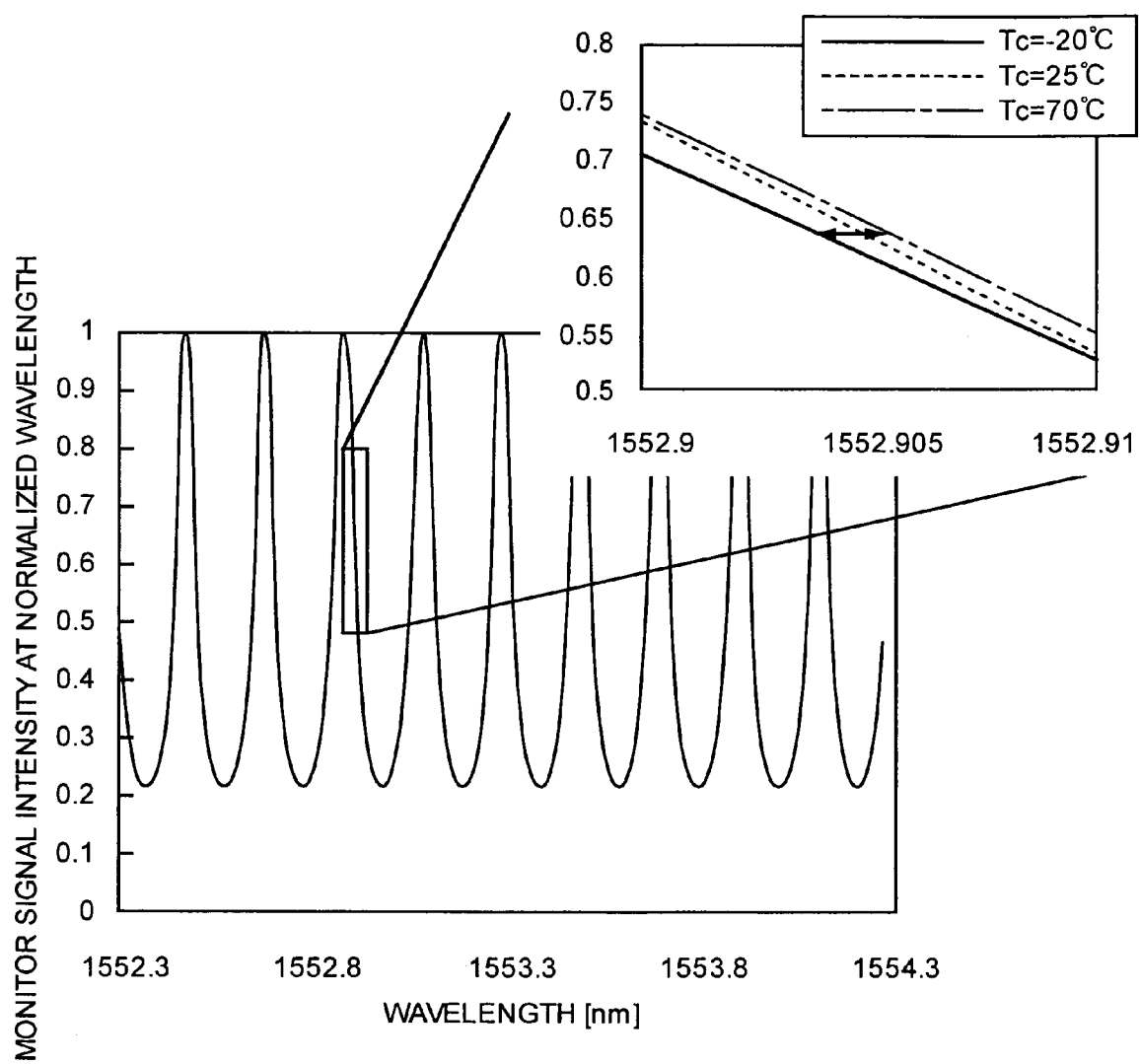
FIG. 9 is a graph that indicates a wavelength-monitor signal characteristic of the semiconductor laser module according to the second embodiment.

FIG. 9 is a graph of wavelength-monitor signal when the temperature of the outside air is set to −20° C., +25° C., and +70° C. The etalon filter 1 fixed on the carrier 14 shows a temperature dependence of 2.5 pm/° C. as a single piece of crystal. However, as explained in the first embodiment, with the etalon filter 1 fixed on the carrier 14 at near the condition for no temperature dependence, it is possible to suppress a wavelength drift within ±1 pm in the entire etalon filter 1 fixed on the carrier 14 (i.e., the entire wavelength monitor), even when the temperature of the etalon filter 1 itself is changed by about 2° C. with a change of the temperature of the outside air from −20° C. to +70° C.

As explained above, according to the second embodiment, since the wavelength monitor 20 is configured with the c-axis angle of the uniaxial birefringent crystal as a material for the etalon filter 1 adjusted in such a manner that the temperature dependence of the wavelength characteristic is eliminated in a state in which the etalon filter 1 according to the first embodiment is bonded on the carrier 14, the etalon filter 1 can satisfy the condition for no temperature dependence or near the condition for no temperature dependence. As a result, the wavelength monitor signal can eliminate a change due to the temperature of the etalon filter 1, making a signal of high precision depending only on a emission wavelength of the semiconductor laser 10.

Furthermore, since the optical axis angle $\phi_c$, of the α-BBO crystal of the etalon filter 1 is set to 90°, as clearly shown in FIG. 8, it is possible to reduce a change of the temperature characteristic due to a change of the optical axis angle $\phi_c$ near this point. Therefore, it is possible to suppress a change of the temperature characteristic due to a deviation of an angle of the laser light. In addition, a change of the wavelength characteristic with respect to a deviation of the optical axis can also be suppressed.

Although, the etalon filter 1 is arranged in such a manner that the input facet and the output facet are perpendicular to the optical axis, according to the second embodiment, the etalon filter 1 can also be arranged at an angle other than the right angle. In such a case, an optical axis propagating in the etalon filter 1 is slant against an incident optical axis because of the refractive index of the etalon filter 1. However, setting of the optical axis angle $\phi_c$ in such a manner that the condition for no temperature dependence according to the first embodiment is satisfied, considering the tilt, can solve the problem. When the etalon filter is arranged with the input facet slant against the optical axis, as explained above, a reflected light from the etalon filter 1 having the wavelength characteristic does not return to the semiconductor laser 10, and as a result, it is possible to obtain a more stabilized laser oscillation. Furthermore, because a stray light to the first light sensitive element 12 and the second light sensitive element 13 via the first lens 11 and a facet of the semiconductor laser 10 is suppressed, the power monitor signal and the wavelength monitor signal are not affected by the reflected light, either.

In addition, because the input facets of the first light sensitive element 12 and the second light sensitive element 13 are tilted against the optical axis, an extremely small amount of reflected light from the first light sensitive element 12 and the second light sensitive element 13 does not return to the first lens 11 and the semiconductor laser 10, an etalon effect between each of the input facets of the first light sensitive element 12 and the second light sensitive element 13 and the first lens 11 or the semiconductor laser 10 can be suppressed. Therefore, it is possible to obtain more stabilized power monitor signal and wavelength monitor signal.

Besides the α-BBO crystal, an optional uniaxial birefringent crystal can be used as long as the material satisfies the condition for no temperature dependence according to the first embodiment, such as a CaCo$_3$ crystal, LiIO$_3$ crystal, and β-BBO crystal. In such a case, because it is possible to adjust the temperature dependence of a single piece of the optional crystal by changing the optical axis angle $\phi_c$, even if a member for fixing the crystal on an optional carrier 14 is used (for example, the adhesive agent 3), the condition for no temperature dependence can be satisfied.

According to the second embodiment, the laser light from the semiconductor laser is set to a p-polarized light, and the laser light is incident on the etalon filter 1 as an ordinary light. However, the laser light from the semiconductor laser can be set to an s-polarized light, and the laser light can be incident on the etalon filter 1 as an extraordinary light. In this case, the same effect can be achieved by using the optical axis angle $\phi_c$ that satisfies Eq. (13), i.e., by using the optical axis angle $\phi_c$ that satisfies the condition for no temperature dependence in a state in which the etalon filter 1 is fixed on the holder 2.

As explained above, according to the present invention, it is possible to obtain a structure, with which a condition for no temperature dependence for the etalon filter fixed on the holder is satisfied, can be obtained by considering an effective linear expansion coefficient and a refractive index change due to a photo-elastic effect by a strain caused by a difference of the rigidity between the etalon filter and the holder in addition to a change of temperature characteristic with respect to the optical axis angle $\phi_c$ of a single piece of the etalon filter.

INDUSTRIAL APPLICABILITY

The present invention is suitable for applying to a wavelength monitor of a semiconductor laser, as a light source, used in a wavelength-division-multiplexing communication and dense-wavelength-division-multiplexing communication employing an optical fiber, and applying to a wavelength filter used in the wavelength monitor.

The invention claimed is:

1. A wavelength filter comprising:
a solid material that is optically transparent and includes a pair of planar surfaces substantially parallel to each other; and
a supporting member that supports the solid material on a planar surface of the solid material, other than the pair of planar surfaces, the supporting member having rigidity higher than that of the solid material, wherein
the solid material is a birefringent material having an optical axis that makes a predetermined angle with respect to a normal to the pair of planar surfaces,
the wavelength filter selects light having a wavelength that is determined by optical length between the pair of planar surfaces, by resonating the light between the pair of planar surfaces, and
the predetermined angle is set so that
the temperature coefficient of the optical length has a predetermined value with the birefringent material fixed on the supporting member, and
absolute value of a sum of (i) a product of (a) difference between linear expansion coefficients of the birefringent material and the supporting member and (b) refractive index of the birefringent material, (ii) thermoptical coefficient of the birefringent material, and (iii) change of refractive index due to a thermal strain between the supporting member and the birefringent material, is minimized.

2. The wavelength filter according to claim 1, wherein the birefringent material is select from the group consisting of an α-BBO crystal, an LiIO$_3$ crystal, a CaCo$_3$ crystal, and a β-BBO crystal.

3. The wavelength monitor according to claim 2, wherein the birefringent material is a CaCo$_3$ crystal,
light incident on the birefringent material has arbitrary polarization along an ordinary light axis, and
the optical axis of the CaCo$_3$ crystal forms an angle of approximately 67 degrees with the light axis.

4. The wavelength filter according to claim 2, wherein the birefringent material is a α-BBO crystal,
light incident on the birefringent material has arbitrary polarization along an ordinary light axis, and
the optical axis of the α-BBO crystal forms an angle of approximately 90 degrees with the light axis.

5. A wavelength monitor that detects wavelength of laser light output from a semiconductor laser, the wavelength monitor comprising:
a wavelength filter that includes a solid material that is optically transparent and includes a pair of planar surfaces substantially parallel to each other, the wavelength filter selecting light having a wavelength that is determined by optical length between the pair of planar surfaces, by resonating the light between the pair of planar surfaces;
a wavelength detecting unit that detects emission wavelength of the laser light based on transmission light transmitted by the wavelength filter; and
a supporting member that supports the wavelength detecting unit and the wavelength filter on a planar surface of the wavelength filter, other than the pair of planar surfaces, the supporting member having a rigidity higher than that of the solid material, wherein
the solid material is a birefringent material having an optical axis that makes a predetermined angle with respect to a normal to the pair of planar surfaces,
the laser light output from the semiconductor laser is polarized in one direction, and
the predetermined angle is set so that
temperature coefficient of the optical length has a predetermined value with the birefringent material fixed on the supporting member, and
absolute value of a sum of (i) a product of (a) difference between linear expansion coefficient of the birefringent material and the supporting member and (b) refractive index of the birefringent material, (ii) thermooptical coefficient of the birefringent material, and (iii) change of refractive index due to thermal strain between the supporting member and the birefringent material is minimized.

6. The wavelength monitor according to claim 5, wherein the birefringent material forming the wavelength filter is selected from the group consisting of an α-BBO crystal, and LiIO$_3$ crystal, a CaCo$_3$ crystal, and a β-BBO crystal.

7. The wavelength of the monitor according to claim 6, wherein
the birefringent material is a CaCo$_3$ crystal,
light incident on the birefringent material has arbitrary polarization along an ordinary light axis, and
the optical axis of the CaCo$_3$ crystal forms an angle of approximately 67 degrees with the light axis.

8. The wavelength filter according to claim 6, wherein
the birefringent material is a α-BBO crystal,
light incident on the birefringent material has arbitrary polarization along an ordinary light axis, and
the optical axis of the α-BBO crystal forms an angle of approximately 90 degrees with the light axis.

9. The wavelength monitor according to claim 5, further comprising a lens that adjusts spot size of the laser light output from the semiconductor laser, and that outputs the laser light with the spot size adjusted to the wavelength filter.

10. The wavelength monitor according to claim 5, wherein the wavelength detecting unit includes
a first photodetector that detects transmisson light transmitted by the wavelength filter and that outputs a first detecting signal;
a second photodetector that directly the laser light output from the semiconductor laser and that outputs a first detecting signal; and
a wavelength detector that detects the emission wavelength of the laser light based on a ratio of the first detecting signal and the second detecting signal.

* * * * *